United States Patent
Liang

(10) Patent No.: US 9,384,686 B2
(45) Date of Patent: Jul. 5, 2016

(54) SHIFT REGISTER, GATE DRIVING CIRCUIT AND REPAIRING METHOD THEREFOR, AND DISPLAY DEVICE

(71) Applicant: BOE TECHNOLOGY GROUP CO., LTD., Beijing (CN)

(72) Inventor: Yinan Liang, Beijing (CN)

(73) Assignee: BOE TECHNOLOGY GROUP CO., LTD, Beijing (CN)

(*) Notice: Subject to any disclaimer, the term of this patent is extended or adjusted under 35 U.S.C. 154(b) by 217 days.

(21) Appl. No.: 14/364,176

(22) PCT Filed: May 22, 2013

(86) PCT No.: PCT/CN2013/076090
§ 371 (c)(1),
(2) Date: Jun. 10, 2014

(87) PCT Pub. No.: WO2014/134877
PCT Pub. Date: Sep. 12, 2014

(65) Prior Publication Data
US 2015/0109285 A1    Apr. 23, 2015

(30) Foreign Application Priority Data
Mar. 7, 2013  (CN) .......................... 2013 1 0072138

(51) Int. Cl.
*G09G 3/00* (2006.01)
*G11C 19/18* (2006.01)
(Continued)

(52) U.S. Cl.
CPC .................. *G09G 3/007* (2013.01); *G09G 3/20* (2013.01); *G11C 19/184* (2013.01); *G11C 19/28* (2013.01);
(Continued)

(58) Field of Classification Search
CPC .......... G09G 3/007; G09G 2310/0286; G09G 2310/08; G09G 2300/043; G09G 2300/0426; G09G 3/00; G09G 3/20; G09G 5/00

USPC ......................................................... 345/214
See application file for complete search history.

(56) References Cited

U.S. PATENT DOCUMENTS 3,077,303 A * 2/1963 Palevsky ............... H03M 1/146
                                                      341/153
3,293,605 A * 12/1966 Moore .................... G08B 25/00
                                                      340/502
(Continued)

FOREIGN PATENT DOCUMENTS

CN          1858841 A       11/2006
CN        101004498 A        7/2007
(Continued)

OTHER PUBLICATIONS

Chinese Office Action of Chinese Application No. 201310072138.8, mailed Feb. 4, 2015 with English translation.
(Continued)

*Primary Examiner* — Fred Tzeng
(74) *Attorney, Agent, or Firm* — Collard & Roe, P.C.

(57) ABSTRACT

A shift register (10), a gate driving circuit and a repairing method therefor, and a display device. The shift register (10) comprises a shift register module (21), a repairing module (22), a first connectable link (L1) arranged between the exciting signal input terminal (P100) of the shift register (10) and the exciting signal input terminals (P210, P220) of these two modules, and a second connectable link (L2) arranged between the output terminal (P101) of the shift register (10) and the output terminals (P211, P221) of these two modules; the shift register module (21) is configured to output a clock signal inputted at the first clock signal input terminal via its own output terminal (211) according to an exciting signal received at its own exciting signal input terminal (P210); the repairing module (22) is configured to output an exciting signal received at its own exciting signal input terminal (P220) after delaying the same by a half clock period via its own output terminal (P221) in a case in which a malfunction occurs in the shift register module (21). Since the shift register module (21) is replaced by the repairing module (22) in a case in which the shift register module (21) has a malfunction, the subsequent shift registers can operate properly.

15 Claims, 6 Drawing Sheets

(51) Int. Cl.
*G11C 19/28* (2006.01)
*G09G 3/20* (2006.01)

(52) U.S. Cl.
CPC .. *G09G 2300/043* (2013.01); *G09G 2300/0426* (2013.01); *G09G 2310/0267* (2013.01); *G09G 2310/0286* (2013.01); *G09G 2310/08* (2013.01); *G09G 2330/08* (2013.01)

(56) References Cited

U.S. PATENT DOCUMENTS

| | | | | |
|---|---|---|---|---|
| 3,458,822 | A * | 7/1969 | Hahn, Jr. | H03K 3/284 326/128 |
| 3,496,477 | A * | 2/1970 | Page | H03K 5/159 327/20 |
| 3,505,478 | A * | 4/1970 | Hisashi | H04B 14/02 327/114 |
| 5,748,872 | A * | 5/1998 | Norman | G02F 1/13318 257/E27.15 |
| 7,267,555 | B2 | 9/2007 | Huang et al. | |
| 7,936,332 | B2 | 5/2011 | Lee et al. | |
| 7,944,241 | B1 * | 5/2011 | Sharma | G06F 1/10 326/16 |
| 8,887,120 | B1 * | 11/2014 | Verma | G06F 17/5031 326/101 |
| 2001/0020988 | A1 * | 9/2001 | Ohgiichi | G02F 1/1345 349/54 |
| 2005/0008114 | A1 | 1/2005 | Moon | |
| 2007/0164972 | A1 | 7/2007 | Chang | |
| 2008/0043006 | A1 * | 2/2008 | Wei | G09G 3/20 345/205 |
| 2008/0048712 | A1 | 2/2008 | Ahn et al. | |
| 2008/0130396 | A1 * | 6/2008 | Gomm | G11C 8/12 365/233.11 |
| 2010/0001941 | A1 | 1/2010 | Shin et al. | |
| 2012/0050633 | A1 * | 3/2012 | Chen | G02F 1/136286 349/42 |
| 2013/0128173 | A1 * | 5/2013 | Wu | G09G 5/00 349/43 |

FOREIGN PATENT DOCUMENTS

| | | |
|---|---|---|
| CN | 101533621 A | 9/2009 |
| CN | 101577106 A | 11/2009 |
| CN | 101625837 B | 5/2012 |
| CN | 203085131 U | 7/2013 |
| EP | 1870877 A2 | 12/2007 |

OTHER PUBLICATIONS

International Search Report, International Preliminary Report on Patentability and Written Opinion of the International Searching Authority of PCT/CN2013/076090 in Chinese, mailed Dec. 12, 2013.

Chinese office Action for Application 201310072138.8 mailed on Jun. 4, 2015 in Chinese with English Translation.

English Translation of the International Search Report of PCT/CN2013/076090 published in English on Sep. 12, 2014.

English translation of International Preliminary Report on Patentability and Written Opinion of the International Searching Authority of PCT/CN2013/076090 issued Sep. 8, 2015.

* cited by examiner

SHIFT REGISTER, GATE DRIVING CIRCUIT AND REPAIRING METHOD THEREFOR, AND DISPLAY DEVICE

CROSS REFERENCE TO RELATED APPLICATIONS

This application is the National Stage of PCT/CN2013/076090 filed on May 22, 2013, which claims priority under 35 U.S.C. §119 of Chinese Application No. 20130072138.8 filed on Mar. 7, 2013, the disclosure of which is incorporated by reference.

TECHNICAL FIELD

The present disclosure relates to the technical field of flat display, and particularly to a shift register, a gate driving circuit and a repairing method therefor, and a display device.

BACKGROUND

Flat displays are developed very rapidly due to its characteristics such as ultrathin thickness and energy-saving. Most flat displays adopt shift registers. At present, shift registers implemented in a Gate on Array (GOA) technique can not only be integrated on a gate driving integrated circuit, but also allow to reduce one manufacturing process of a display panel, thus saving cost. As a result, in recent years, the GOA technique is widely applied to the manufacturing process of the flat display.

The existing problem in the GOA technique is in that a present stage of shift register implemented in the GOA technique depends on an output signal of a previous stage of shift register, that is, since the output signal of the previous stage of shift register functions as an input signal of the present stage of shift register, and if an exception occurs in the output signal of the previous stage of shift register due to a failure or an invalidation of the previous stage of shift register, subsequent shift registers cannot output signals properly; that is to say, such a case can result in that the whole GOA circuit malfunctions, and even cannot operate.

Further, in an actual production manufacturing, since it is difficult for a yield ratio of a Thin Film Transistor (TFT) backboard to reach 100%, it is possible that a defect occurs in the TFTs of a shift register in the GOA circuit, which can lead to the failure of the shift register, and thus it can result in a breakdown of the whole GOA circuit.

SUMMARY

In embodiments of the present disclosure, there are provided a shift register, a gate driving circuit and a repairing method therefor, and a display device, which are configured to address the issue that the whole GOA circuit cannot operate properly due to the malfunction of one of shift registers in the existing GOA circuit.

The technical solutions of the embodiments of the present disclosure are as follows.

The shift register comprises an output terminal, an exciting signal input terminal, a first clock signal input terminal, a first connectable link, a second connectable link, a shift register module and a repairing module. The shift register module comprises a first internal output terminal, a first internal exciting signal input terminal, and a first internal clock signal input terminal configured to receive a clock signal inputted from the first clock signal input terminal of the shift register; the repairing module comprises a second internal output terminal and a second internal exciting signal input terminal.

The first connectable link is arranged between the exciting signal input terminal of the shift register, the first internal exciting signal input terminal of the shift register module and the second internal exciting signal input terminal of the repairing module, and is configured to disconnect a connection between the first internal exciting signal input terminal of the shift register module and the exciting signal input terminal of the shift register and establish a connection between the second internal exciting signal input terminal of the repairing module and the exciting signal input terminal of the shift register in a case in which a malfunction occurs in the shift register module.

The second connectable link is arranged between the output terminal of the shift register, the first internal output terminal of the shift register module and the second internal output terminal of the repairing module, and is configured to establish a connection between the second internal output terminal of the repairing module and the output terminal of the shift register in a case in which a malfunction occurs in the shift register module.

The shift register module is configured to output a clock signal received at its own first internal clock signal input terminal via its own first internal output terminal according to an exciting signal received at its own first internal exciting signal input terminal.

The repairing module is configured to output an exciting signal received at its own second internal exciting signal input terminal after delaying the same by a half clock period via its own second internal output terminal in a case in which a malfunction occurs in the shift register module.

The gate driving circuit comprises a plurality of stages of shift registers as described above.

Except for a first stage of shift register and a last stage of shift register, an output terminal of each stage of shift registers is connected to a reset signal input terminal of a previous stage of shift register adjacent thereto and an exciting signal input terminal of a subsequent stage of shift register adjacent thereto; the gate driving circuit is configured to output signals in sequence which are outputted from the output terminals of respective stages of shift registers.

An output terminal of the first stage of shift register is connected to an exciting signal input terminal of a second stage of shift register, and an output terminal of the last stage of shift register is connected to an reset signal input terminal of a previous stage of shift register adjacent thereto.

The exciting signal input terminal of the first stage of shift register is configured to input a frame start signal.

The repairing method for the gate driving circuit as described comprises: when a malfunction occurs in any one of shift register modules of the gate driving circuit, disconnecting a connection between the first internal exciting signal input terminal of the shift register module having the malfunction and the exciting signal input terminal of the shift register to which the shift register module having the malfunction belongs, and establishing a connection between the second internal exciting signal input terminal of the repairing module of the shift register and the exciting signal input terminal of the shift register; and establishing a connection between the second internal output terminal of the repairing module of the shift register and the output terminal of the shift register.

The display device comprises the gate driving circuit as described above.

In the embodiments of the present disclosure, since the shift register comprises the repairing module configured to output the exciting signal received at the second internal exciting signal input terminal of the repairing module after delaying the same by a half clock period via the second internal output terminal of the repairing module, the first connectable link is arranged between the exciting signal input terminal of the shift register, the first internal exciting signal input terminal of the shift register module and the second internal exciting signal input terminal of the repairing module, and the second connectable link is arranged between the output terminal of the shift register, the first internal output terminal of the shift register module and the second internal output terminal of the repairing module. Therefore, it is achievable that the shift register module can be replaced by the repairing module by controlling the connection establishing and disconnecting functions of the first and second connectable links in a case in which the shift register module for implementing the shift function in the shift register is invalid or malfunctions, so that when the shift register module in one of shift registers in a GOA circuit has a malfunction or is invalid, the shift register can still operate properly by means of the repairing module in the shift register without affecting the operation of the subsequent shift registers.

DETAILED DESCRIPTION

Detailed descriptions will be given to implementations of a shift register, a gate driving circuit and a repairing method therefor, and a display device provided in the embodiments of the present disclosure with reference to the accompanying drawings of the specification.

First Embodiment

Figure 1:
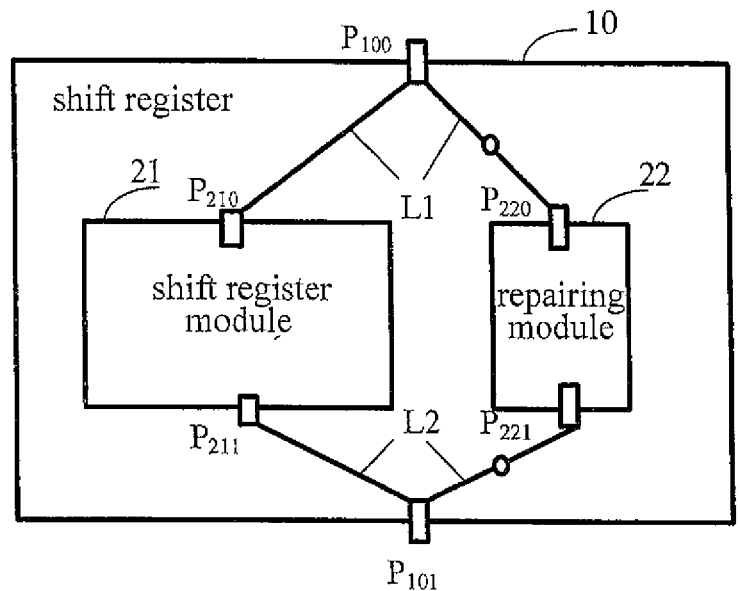
FIG. 1 is a schematic diagram showing a structure of a shift register in a first embodiment of the present disclosure.

A shift register 10 according to a first embodiment of the present disclosure is shown in FIG. 1, wherein the shift register 10 comprises a first connectable link L1, a second connectable link L2, an exciting signal input terminal $P_{100}$, an output terminal $P_{101}$, a first clock signal input terminal (not shown in FIG. 1), a shift register module 21 and a repairing module 22. The shift register module 21 comprises an exciting signal input terminal $P_{210}$, an output terminal $P_{211}$, and a first clock signal input terminal configured to receive a clock signal inputted from the first clock signal input terminal of the shift register 10 (not shown in FIG. 1); the repairing module 22 comprises an exciting signal input terminal $P_{220}$ and an output terminal $P_{221}$.

The first connectable link L1 is arranged between the exciting signal input terminal $P_{100}$ of the shift register 10, the exciting signal input terminal $P_{210}$ of the shift register module 21 and the exciting signal input terminal $P_{220}$ of the repairing module 22, and is configured to disconnect a connection between the exciting signal input terminal $P_{210}$ of the shift register module 21 and the exciting signal input terminal $P_{100}$ of the shift register 10 and establish a connection between the exciting signal input terminal $P_{220}$ of the repairing module 22 and the exciting signal input terminal $P_{100}$ of the shift register 10 in a case in which a malfunction occurs in the shift register module 21.

For example, as shown in FIG. 1, the first connectable link L1 comprises a first branch and a second branch, wherein the first branch of the first connectable link L1 is arranged between the exciting signal input terminal $P_{100}$ of the shift register 10 and the exciting signal input terminal $P_{210}$ of the shift register module 21, and the second branch of the first connectable link L1 is arranged between the exciting signal input terminal $P_{100}$ of the shift register 10 and the exciting signal input terminal $P_{220}$ of the repairing module 22. In a case in which the shift register module 21 operates normally, the first branch of the first connectable link L1 connects the exciting signal input terminal $P_{100}$ of the shift register 10 and the exciting signal input terminal $P_{210}$ of the shift register module 21, while in a case in which a malfunction occurs in the shift register module 21, the first branch of the first connectable link L1 is disconnected, and the second branch of the first connectable link L1 connects the exciting signal input terminal $P_{100}$ of the shift register 10 and the exciting signal input terminal $P_{220}$ of the repairing module 22.

The second connectable link L2 is arranged between the output terminal $P_{101}$ of the shift register 10, the output terminal $P_{211}$ of the shift register module 21 and the output terminal $P_{221}$ of the repairing module 22, and is configured to establish a connection between the output terminal $P_{221}$ of the repairing module 22 and the output terminal $P_{101}$ of the shift register 10 in a case in which a malfunction occurs in the shift register module 21.

For example, as shown in FIG. 1, the second connectable link L2 comprises a first branch and a second branch, wherein the first branch of the second connectable link L2 is arranged between the output terminal $P_{101}$ of the shift register 10 and the output terminal $P_{211}$ of the shift register module 21, and the second branch of the second connectable link L2 is arranged between the output terminal $P_{101}$ of the shift register 10 and the output terminal $P_{221}$ of the shift register module 21. In a case in which a malfunction occurs in the shift register module 21, the second branch connects the output terminal $P_{101}$ of the shift register 10 and the output terminal $P_{221}$ of the repairing module 22.

The shift register module 21 outputs a clock signal inputted at its own first clock signal input terminal via its own output terminal $P_{211}$ according to an exciting signal received at its own exciting signal input terminal $P_{210}$. For example, when the exciting signal is valid, the shift register module 21 outputs a clock signal inputted at its own first clock signal input terminal via its own output terminal $P_{211}$.

In a case in which a malfunction occurs in the shift register module 21, the repairing module 22 outputs an exciting signal received at its own exciting signal input terminal $P_{220}$ after delaying the same by a half clock period via its own output terminal $P_{221}$.

Since both the exciting signal and the clock signal are pulse signals having a high level of a half clock period, the exciting signal after being delayed by a half clock period outputted from the repairing module 22 drives a gate line in the same way as the clock signal drives the gate line. Consequently, when a malfunction occurs in the shift register module 21, the shift register module 21 can be replaced by the repairing module 22.

It should be noted that the above shift register module 21 can be any one of the existing shift registers, and when no malfunction occurs in the shift register module 21, in general, the terminal $P_{100}$ and the terminal $P_{210}$ are connected and the terminal $P_{101}$ and the terminal $P_{211}$ are connected, while the terminal $P_{100}$ and the terminal $P_{220}$ are disconnected and the terminal $P_{101}$ and the terminal $P_{221}$ are disconnected. Therefore, in FIG. 1, when representing the first connectable link L1, a solid line represents a connection between the terminal $P_{100}$ and the terminal $P_{210}$ (that is, the solid line represents the first branch of L1), and a solid line with a circle inserted therein represents a connection between the terminal $P_{100}$ and the terminal $P_{220}$ (that is, the solid line with the circle inserted therein represents the second branch of L1); similarly, when representing the second connectable link L2, a solid line represents a connection between the terminal $P_{101}$ and the terminal $P_{211}$ (that is, the solid line represents the first branch of L2), and a solid line with a circle inserted therein represents a connection between the terminal $P_{101}$ and the terminal $P_{221}$ (that is, the solid line with the circle inserted therein represents the second branch of L2).

In the technical solution of the first embodiment of the present disclosure, the shift register comprises the repairing module 22, the first connectable link L1 and the second connectable link L2. The repairing module 22 has a function of outputting an exciting signal inputted at its own exciting signal input terminal after delaying the same by a half clock signal. Therefore, the repairing module 22 can replace the shift register module 22 having a malfunction to achieve a shifting function, so that, from a viewpoint outside of the shift register 10, a shift function is realized by utilizing the repairing module 22, the first connectable link L1 and the second connectable link L2 when a malfunction occurs in the shift register module 21.

In the first embodiment of the present disclosure, there is no limitation on the specific circuit for achieving the function of the repairing module 22, and it can be any circuit which outputs a received exciting signal after delaying the same by a half clock period, and can also be a circuit which outputs a received exciting signal after delaying the same by a half clock period according to a clock signal inputted at its own first clock signal input terminal.

Hereinafter, a further description will be given to the technical solution of the first embodiment of the present disclosure in connection with a second embodiment of the present disclosure.

Second Embodiment

Figure 2:
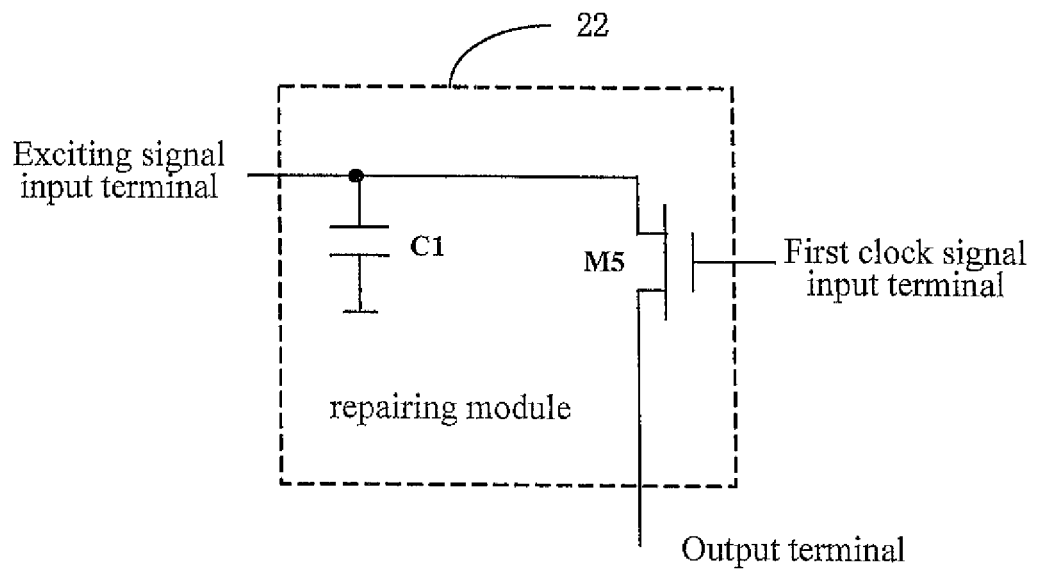
FIG. 2 is a circuit diagram of a repairing module in a second embodiment of the present disclosure.

On the basis of the first embodiment of the present disclosure, in the second embodiment of the present disclosure, there is provided a shift register, and FIG. 2 shows a circuit diagram of a specific circuit for realizing the function of the repairing module 22 in the shift register, wherein the repairing module 22 in the shift register comprises a first capacitor C1 and a fifth transistor M5.

One terminal of the first capacitor C1 is connected to an exciting signal input terminal of the repairing module, and the other terminal of the first capacitor C1 is grounded.

The gate of the fifth transistor M5 is connected to a first clock signal input terminal, a first terminal of the fifth transistor M5 is connected to the exciting signal input terminal of the repairing module 22, and a second terminal of the fifth transistor M5 is connected to an output terminal of the repairing module 22. It should be appreciated that, for example, the first clock signal input terminal connected to the gate of the fifth transistor M5 can be the first clock signal input terminal of the shift register 10 or the first clock signal input terminal of the shift register module 21, and can also be its own first clock signal input terminal, as long as it inputs a gate control signal outputted after delaying the exciting signal received by the fifth transistor M5 by a half clock period. So, no limitation is made to the specific implementation of the first clock signal input terminal connected to the gate of the fifth transistor M5.

The operational principle of the repairing module comprising the first capacitor C1 and the fifth transistor M5 is as follows:

When the exciting signal input terminal of the repairing module 22 receives an exciting signal (a half clock period), the first clock signal input terminal inputs a signal at a first level, and the fifth transistor M5 is turned off by the signal at the first level, so that the exciting signal charges the first capacitor C1. Within another half clock period after completing the receipt of the exciting signal, the first clock signal input terminal inputs a signal at a second level; and the fifth transistor M5 is turned on by the signal at the second level, so that the first capacitor C1 is discharged and the stored exciting signal is outputted to the output terminal of the repairing module 22.

Figure 3:
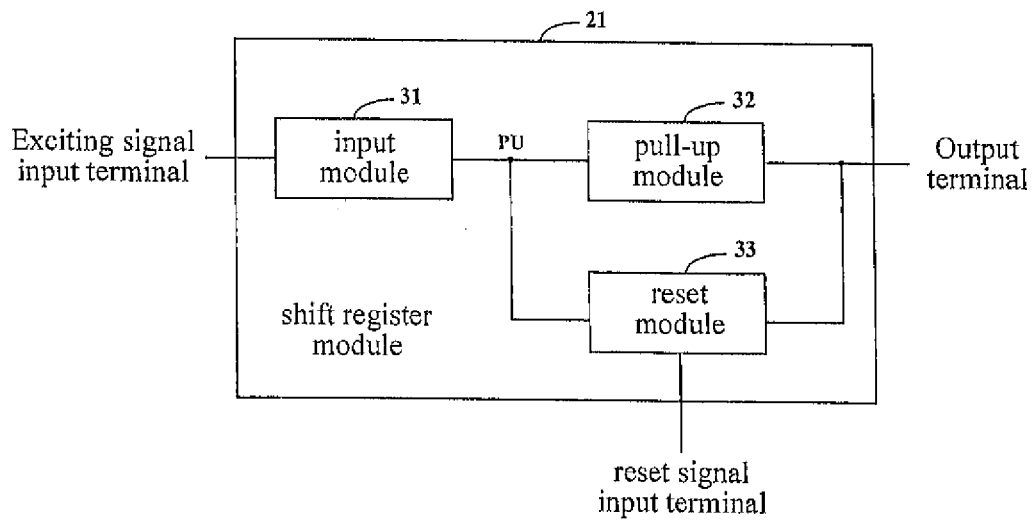
FIG. 3 is a schematic diagram showing a structure of a shift register module in the second embodiment of the present disclosure.

In addition, the shift register 10 can further comprise a reset signal input terminal, and the shift register module 21 can further comprise a reset signal input terminal for receiving a reset signal, wherein the reset signal input terminal of the shift register 10 is connected to the reset signal input terminal of the shift register module 21. FIG. 3 shows a schematic structure of the shift register module 21, wherein the shift register module 21 comprises an input module 31, a pull-up module 32 and a reset module 33.

The input module 31 receives an exciting signal from an exciting signal input terminal of the shift register module 21, and outputs a pull-up control signal to a pull-up node PU between the input module and the pull-up module.

The pull-up module 32 supplies a signal inputted at the first clock signal input terminal to an output terminal of the shift register module 21 according to the pull-up control signal at the pull-up node PU. For example, when the pull-up control signal at the pull-up node PU is active (for example, it is active when it is at a first level or it is active when it is at a second level), the pull-up module 32 supplies the signal inputted at the first clock signal input terminal to the output terminal of the shift register module 21.

The reset module 33 supplies a power supply voltage to the pull-up node PU and the output terminal of the shift register module 21 according to a reset signal received at the reset signal input terminal of the shift register module 21. For example, when the reset signal received at the reset signal input terminal of the shift register module 21 is active (for example, it is active when it is at a first level or it is active when it is at a second level), the reset module 33 supplies the power supply voltage to the pull-up node PU and the output terminal of the shift register module 21.

Hereinafter, an illustrative description will be given to a specific circuit having the above input module 31, the pull-up module 32 and the reset module 33.

Figure 4:
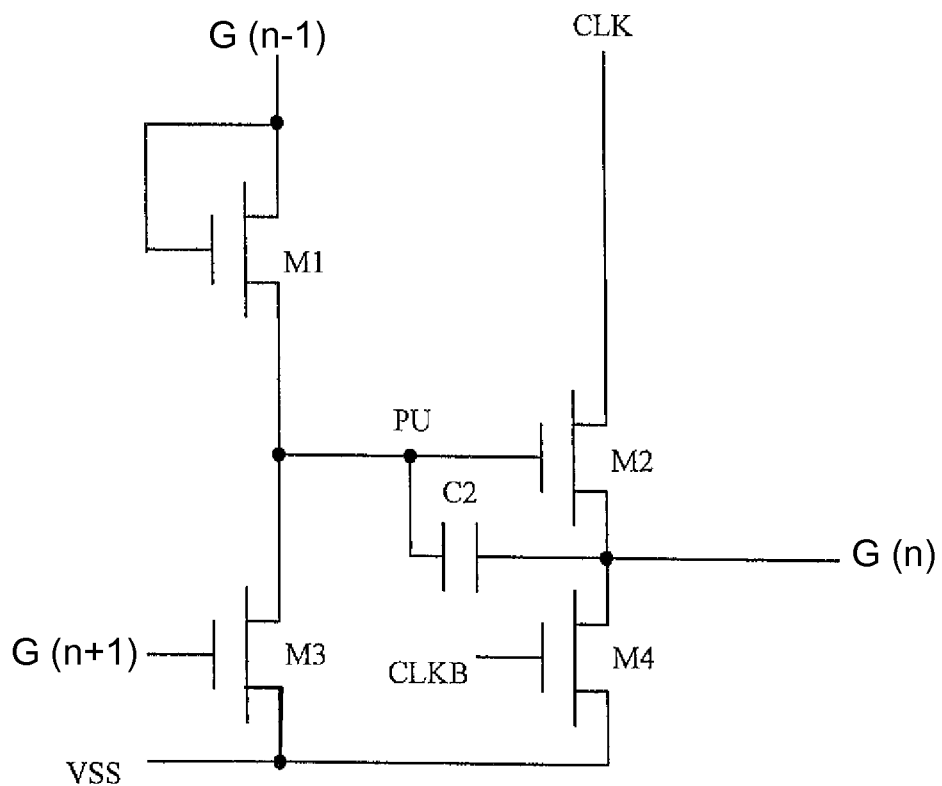
FIG. 4 is a schematic diagram showing a circuit structure of a shift register module in the second embodiment of the present disclosure.

FIG. 4 shows a circuit diagram of a shift register module 21 having the above input module 31, the pull-up module 32 and the reset module 33.

The input module 31 comprises a first transistor M1, wherein a first terminal of the first transistor M1 and the gate of the first transistor M1 are connected to the exciting signal input terminal of the shift register module together, and a second terminal of the first transistor M1 is connected to the pull-up node PU.

The pull-up module 32 comprises a second transistor M2 and a second capacitor C2. The gate of the second transistor M2 is connected to the pull-up node PU, a first terminal of the second transistor M2 is connected to the first clock signal input terminal, and a second terminal of the second transistor M2 is connected to the output terminal of the shift register module. One terminal of the second capacitor C2 is connected to the pull-up node PU, and the other terminal of the second capacitor C2 is connected to the output terminal of the shift register module.

Optionally, a ratio of a capacitance of the first capacitor C1 to that of the second capacitor C2 is greater than or equal to 5:1. Such a ratio makes that a first capacitor C1 in a present stage of shift register charges a second capacitor C2 in a shift register module of a subsequent stage of shift register (similar to a electric charge redistribution between capacitors) and a voltage across the second capacitor C2 in the subsequent stage of shift register is maintained at a high voltage, so that a normal operation of the subsequent stage of shift register is achieved through the bootstrapping effect of the second capacitor C2 in the subsequent stage of shift register.

Optionally, the shift register can further comprise a second clock signal input terminal, and the shift register module 21 can further comprise a second clock signal input terminal for receiving a clock signal inputted at the second clock signal input terminal of the shift register. The reset module 33 comprises a third transistor M3 and a fourth transistor M4.

The gate of the third transistor M3 is connected to the reset signal input terminal of the shift register module 21, a first terminal of the third transistor M3 is connected to the pull-up node PU, and a second terminal of the third transistor M3 is connected to a power supply voltage input terminal. The gate of the fourth transistor M4 is connected to the second clock signal input terminal, a first terminal of the fourth transistor M4 is connected to the output terminal of the shift register module 21, and a second terminal of the fourth transistor M4 is connected to the power supply voltage input terminal.

Figure 5:
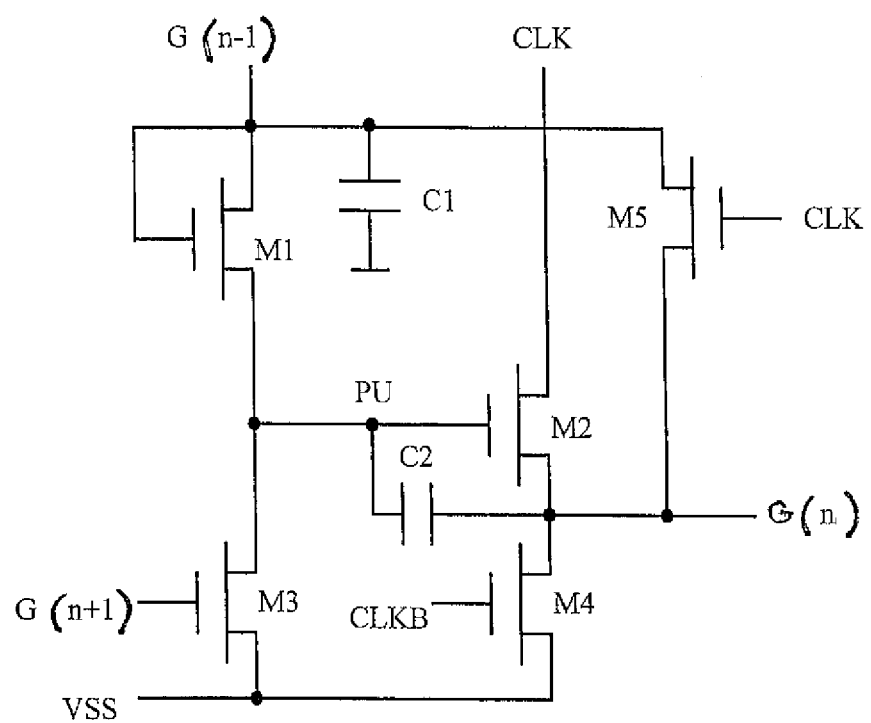
FIG. 5 is a circuit diagram of a shift register in the second embodiment of the present disclosure.

FIG. 5 shows a circuit diagram of a shift register comprising the repairing module shown in FIG. 2 and the shift register module 21 shown in FIG. 4 according to the second embodiment of the present disclosure.

In the shift register shown in FIG. 5, in a case in which no malfunction occurs in the shift register module, the first connectable link L1 is configured to establish a connection between the exciting signal input terminal of the shift register module and the exciting signal input terminal of the shift register, and to establish a connection between the exciting signal input terminal of the repairing module and the exciting signal input terminal of the shift register. In a case in which no malfunction occurs in the shift register module, the second connectable link L2 is configured to establish a connection between the output terminal of the shift register module and the output terminal of the shift register, and to establish a connection between the output terminal of the repairing module and the output terminal of the shift register.

Of course, as an alternative, in a case in which no malfunction occurs in the shift register module, the first connectable link L1 is configured to establish a connection between the exciting signal input terminal of the shift register module and the exciting signal input terminal of the shift register, and to establish a connection between the exciting signal input terminal of the repairing module and the exciting signal input terminal of the shift register. In a case in which no malfunction occurs in the shift register module, the second connectable link L2 is configured to establish a connection between the output terminal of the shift register module and the output terminal of the shift register, and to establish a connection between the output terminal of the repairing module and the output terminal of the shift register.

Accordingly, in a case in which a malfunction occurs in the shift register module, the first connectable link L1 is configured to disconnect the connection between the exciting signal input terminal of the shift register module and the exciting signal input terminal of the shift register, and to establish the connection between the exciting signal input terminal of the repairing module and the exciting signal input terminal of the shift register. In a case in which a malfunction occurs in the shift register module, the second connectable link L2 is configured to establish or disconnect the connection between the output terminal of the shift register module and the output terminal of the shift register, and to establish the connection between the output terminal of the repairing module and the output terminal of the shift register.

In the embodiments of the present disclosure, a connection mode of the first terminal and the second terminal of each transistor can be exchanged, and thus the first terminal of the transistor recited in the embodiments of the present disclosure can be a drain or a source of the transistor, and the second terminal of the transistor can be a source or a drain of the transistor. Further, it is unnecessary that all the first terminals of the five transistors are sources or drains simultaneously, and that all the second terminals of the five transistors are drains or sources simultaneously. That is, the first terminals of any t transistors of the first to fifth transistors are drains and the second terminals thereof are sources, the first terminals of (5-t) transistors of the first to fifth transistors are sources and the second terminals thereof are drains, wherein $0 \leq t \leq 5$.

In order to further illustrate the operational principle of the second embodiment of the present disclosure, by taking the shift register shown in FIG. 5 as an example, detailed descriptions will be given to the operational principle of the shift register shown in FIG. 5 when a malfunction occurs therein and when no malfunction occurs therein in connection with the scan timing shown in FIG. 6.

Figure 6:
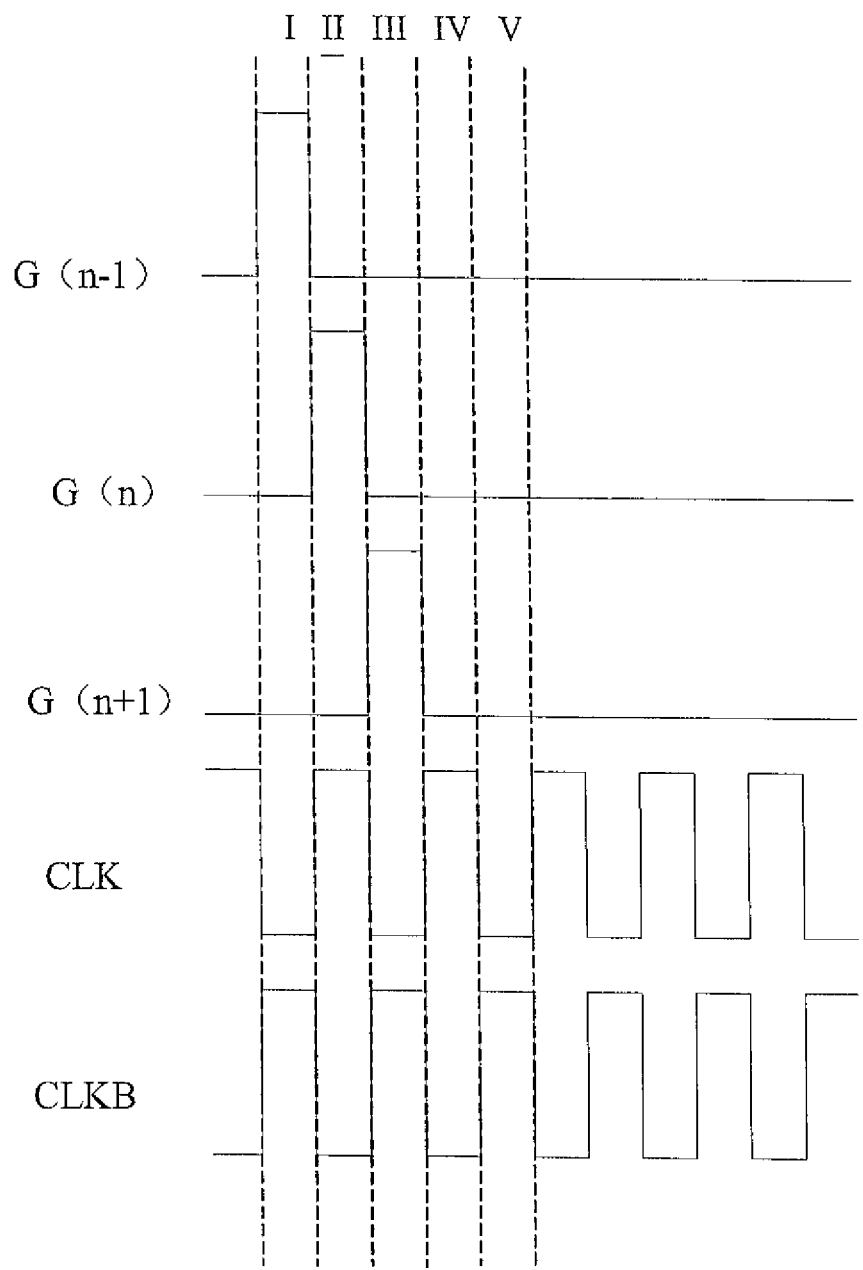
FIG. 6 is a scan timing diagram of the shift register in the second embodiment of the present disclosure.

FIG. 6 shows a schematic scan timing chart of the shift register provided in the second embodiment of the present disclosure.

CLK represents a first clock signal inputted at the first clock signal input terminal of a present stage of shift register S/R(n); CLKB represents a second clock signal inputted at the second clock signal input terminal of the present stage of shift register S/R(n); G(n−1) represents a signal outputted from the output terminal of a previous stage of shift register S/R(n−1) as an input signal of the present stage of shift register S/R(n), that is, an exciting signal; G(n+1) represents a signal outputted from the output terminal of a subsequent stage of shift register S/R(n+1) as a reset signal of the present stage of shift register S/R(n); VSS represents a power supply voltage inputted to the present stage of shift register S/R(n), and is a low level signal; and G(n) is a signal outputted from the output terminal of the present stage of shift register S/R(n).

1. When no malfunction occurs in the shift register module, the scan timing procedure of the present stage of shift register S/R(n) can be divided into five phases (in FIG. 6, I, II, III, IV and V represent the five phases respectively).

During a first phase, that is, during a first half period of a first clock period, the present stage of shift register S/R(n) receives a high level signal at the output terminal G(n−1) of the previous stage of shift register S/R(n−1), and thus in the present stage of shift register S/R(n), the first transistor M1 is turned on, the first capacitor C1 and the second capacitor C2 are charged, the potential at the pull-up node PU is increased, and thus the second transistor M2 is turned on, G(n) outputs the first clock signal CLK at a low level. Since the first clock signal CLK is at a low level, the fifth transistor M5 is turned off. Since G(n+1) is at a low level, the third transistor M3 is turned off. Since the second clock signal CLKB is at a high level, the fourth transistor M4 is turned on, G(n) outputs the power supply voltage VSS. Therefore, G(n) outputs a low level signal during this phase.

During a second phase, that is, during a second half period of the first clock period, the exciting signal inputted to the present stage of shift register S/R(n) is at a low level (i.e., the G(n−1) at a low level during this phase), and thus the first transistor M1 is turned off. Since the reset signal inputted to the present stage of shift register S/R(n) is at a low level (i.e., the G(n+1) at a low level during this phase), the third transistor M3 is turned off. Since the pull-up node PU is still maintained at a high level, the second transistor M2 is kept on, and the first clock signal CLK at a high level is outputted via the second transistor M2, that is, G(n) is at a high level. Since the first clock signal CLK is at a high level during this phase, the fifth transistor M5 is turned on, and the first capacitor C1 is discharged; meanwhile, the discharging of the first capacitor C1 makes an enhancement on the high level signal outputted from G(n).

During a third phase, that is, during a first half period of a second clock period, the exciting signal inputted to the present stage of shift register S/R(n) is at a low level (i.e., the G(n−1) at a low level during this phase), and thus the first transistor M1 is turned off. Since the reset signal inputted to the present stage of shift register S/R(n) is at a high level (that is, the signal G(n+1) outputted from the output terminal of the subsequent stage of shift register S/R(n+1) is at a high level during this phase), the third transistor M3 is turned on, and thus the power supply voltage VSS is inputted to the pull-up node PU via the third transistor M3. Since the second clock signal CLKB is at a high level, the fourth transistor M4 is turned on, and the power supply voltage VSS is outputted to the output terminal via the fourth transistor M4, so that the signal G(n) outputted from the present stage of shift register S/R(n) is at a low level. Therefore, the second capacitor C2 is discharged, the potential at the pull-up node PU is decreased, and thus the second transistor M2 is turned off. Meanwhile, the first clock signal CLK is at a low level, and thus the fifth transistor M5 is turned off.

During a fourth phase, that is, during a second half period of the second clock period, only the first clock signal is at a high level, and other signals inputted to the present stage of shift register S/R(n) are all at a low level; thus the fifth transistor M5 is turned on, and the signal G(n) outputted from the present stage of shift register S/R(n) is at a low level.

During a fifth phase, that is, during a first half period of a third clock period, only the second clock signal is at a high level, and other signals inputted to the present stage of shift register S/R(n) are all at a low level; thus the fourth transistor M4 is turned on, and the signal G(n) outputted from the present stage of shift register S/R(n) is at a low level.

Thereafter, the fourth phase and the fifth phase are repeated until the present stage of shift register S/R(n) receives a high level signal G(n−1) outputted from the output terminal of the previous stage of shift register S/R(n−1), the first phase is performed again.

By the above analysis, in a case in which no malfunction occurs in the shift register module included in the shift register shown in FIG. 5, it is unnecessary to disconnect the exciting signal input terminal of the repairing module and the exciting signal input terminal of the shift register, and it is unnecessary to disconnect the output terminal of the repairing module and the output terminal of the shift register, the repairing module assists the output of the shift register module during the second phase. Naturally, in a case in which no malfunction occurs in the shift register module included in the shift register shown in FIG. 5, it is possible to disconnect the exciting signal input terminal of the repairing module and the exciting signal input terminal of the shift register and to disconnect the output terminal of the repairing module and the output terminal of the shift register, the repairing module is not in operation.

2. When a malfunction occurs in the shift register module, the connection between the exciting signal input terminal of the shift register module and the exciting signal input terminal of the shift register is disconnected. In an actual operation, when a malfunction occurs in the shift register module, the connection between the exciting signal input terminal of the shift register module and the exciting signal input terminal of the shift register can be cut off by a laser repairing technique; that is, the exciting signal input terminal of the shift register is disconnected from the first transistor M1. However, in the shift register shown in FIG. 5, it is possible that the connection between the output terminal of the shift register module and the output terminal of the shift register is disconnected or is not disconnected. Hereinafter, detailed descriptions will be given to the operational principle of the shift register in a case in which the connection between the output terminal of the shift register module and the output terminal of the shift register is not disconnected and in a case in which the connection between the output terminal of the shift register module and the output terminal of the shift register is disconnected respectively with reference to FIG. 5 and FIG. 6.

(1) when a malfunction occurs in the shift register module of the shift register, in a case in which the connection between the exciting signal input terminal of the shift register module and the exciting signal input terminal of the shift register is disconnect and the connection between the output terminal of the shift register module and the output terminal of the shift register is disconnect, the operational procedure of the shift register can be divided into two phases, wherein a first phase is a capacitor charging phase, and a second phase is a signal outputting phase.

During the first phase, that is, during a first half period of a first clock period, S/R(n−1) outputs a high level signal, and the first clock signal CLK is at a low level; thus, the first capacitor C1 is charged, the fifth transistor M5 is turned off, and the signal G(n) outputted from the output terminal of the shift Register S/R(n) is at a low level.

During the second phase, that is, during a second half period of the first clock period, S/R(n−1) outputs a low level signal, and the first clock signal CLK is at a high level; thus, the fifth transistor M5 is turned on, and the first capacitor C1 outputs the stored voltage to the output terminal of the shift register S/R(n) via the fifth transistor M5, so that the signal G(n) outputted from the output terminal of the shift Register. S/R(n) is at a high level.

(2) when a malfunction occurs in the shift register module of the shift register, in a case in which the connection between the exciting signal input terminal of the shift register module and the exciting signal input terminal of the shift register is disconnect and the connection between the output terminal of the shift register module and the output terminal of the shift register is not disconnect, the operational procedure of the shift register can be divided into four phases as below.

During a first phase, that is, during a first half period of a first clock period, the signal G(n−1) outputted from the shift register S/R(n−1) is at a high level, the first clock signal CLK is at a low level, the first capacitor C1 is charged, the fifth transistor M5 is turned off, and the signal G(n) outputted from the output terminal of the shift register S/R(n) is at a low level. At this time, the reset signal G(n+1) outputted from the shift register S/R(n+1) is at a low level, and thus the third transistor M3 is turned off; the second clock signal CLKB is at a high level, and thus the fourth transistor M4 is turned on, such that the power supply voltage VSS makes the signal G(n) outputted from the output terminal of the shift register S/R(n) be at a low level via the fourth transistor M4.

During a second phase, that is, during a second half period of the first clock period, the signal G(n−1) outputted from the shift register S/R(n−1) is at a low level, the first clock signal CLK is at a high level, and the fifth transistor M5 is turned on, such that the first capacitor C1 outputs the stored voltage to the output terminal of the shift register S/R(n) via the fifth transistor M5, and thus the signal G(n) outputted from the output terminal of the shift register S/R(n) is at a high level. Further, at this time, the reset signal G(n+1) outputted from the shift register S/R(n+1) is at a low level, and thus the third transistor M3 is turned off; the second clock signal CLKB is at a low level, and thus the fourth transistor M4 is turned off, so that the signal G(n) outputted from the output terminal of the shift register S/R(n) would not be affected.

During a third phase, that is, during a first half period of a second clock period, the signal G(n−1) outputted from the shift register S/R(n−1) is at a low level, the first clock signal CLK is at a low level, and thus the fifth transistor M5 is turned off. At this time, the reset signal G(n+1) outputted from the shift register S/R(n+1) is at a high level, and thus the third transistor M3 is turned on; the second clock signal CLKB is at a high level, and thus the fourth transistor M4 is turned on, the power supply voltage VSS makes the signal G(n) outputted from the output terminal of the shift register S/R(n) be at a low level via the fourth transistor M4, so that the signal G(n) outputted from the output terminal of the shift register S/R(n) would not be affected either.

During a fourth phase, that is, during a second half period of the second clock period, the signal G(n−1) outputted from the shift register S/R(n−1) is at a low level, the first clock signal CLK is at a high level, and the fifth transistor M5 is turned on. At this time, the reset signal G(n+1) outputted from the shift register S/R(n+1) is at a low level, and thus the third transistor M3 is turned off; the second clock signal CLKB is at a low level, and thus the fourth transistor M4 is turned off, so that the signal G(n) outputted from the output terminal of the shift register S/R(n) would not be affected either.

It can be known from the above analysis on the operational procedure of the shift register according to the second embodiment of the present disclosure that, in the shift register according to the second embodiment of the present disclosure, it is realized that, in a case in which a malfunction occurs in the shift register module included in the shift register, the shift register module is replaced by the repairing module in functionality, so that it is ensured that the operation of the subsequent stages of shift registers would not be affected by the present stage of shift register having a malfunction.

Hereinafter, a description will be given to a gate driving circuit comprising a plurality of shift registers as described above.

Third Embodiment

Figure 7:
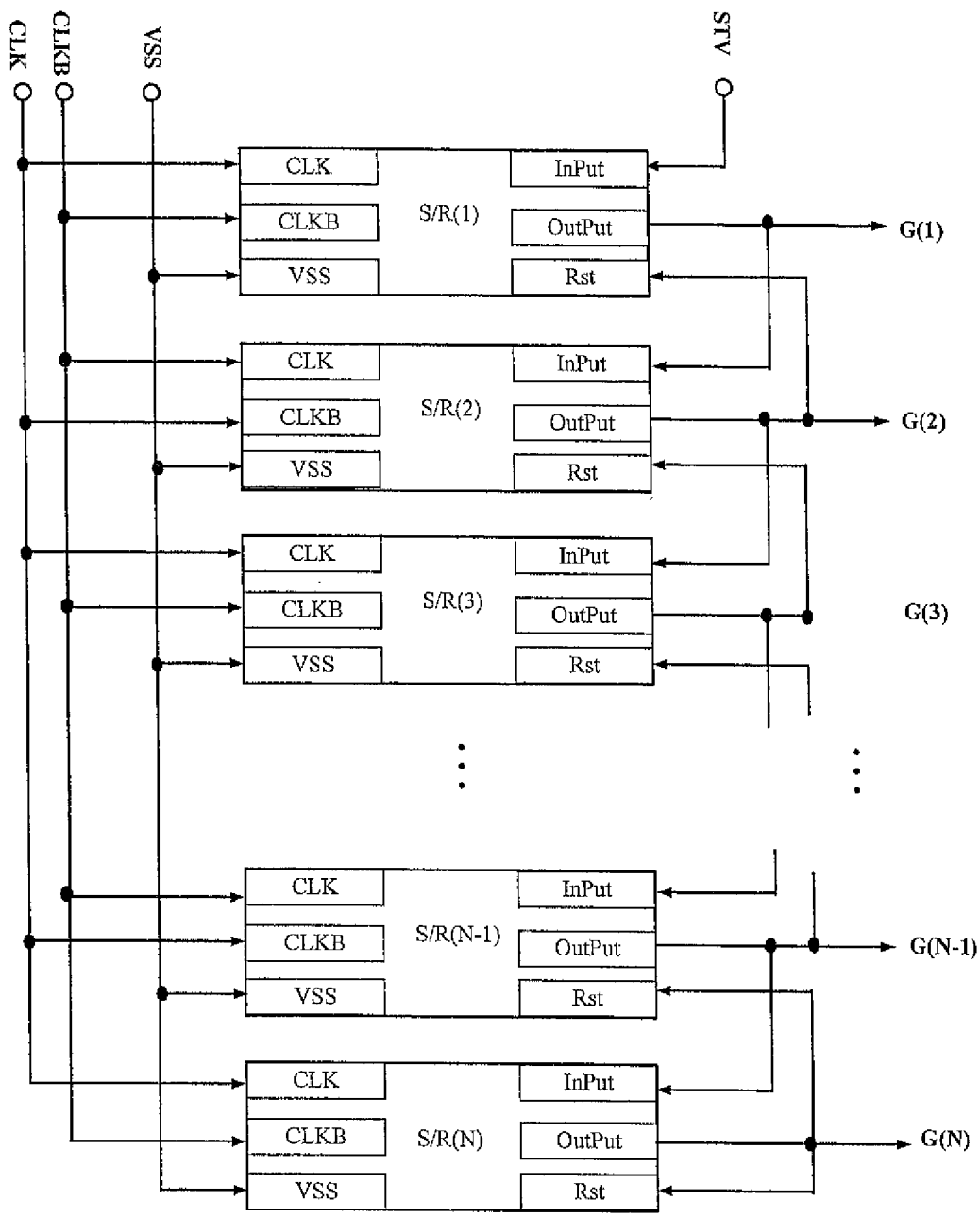
FIG. 7 is a schematic diagram showing a structure of a gate driving circuit in a third embodiment of the present disclosure.

FIG. 7 shows a schematic structure diagram of a gate driving circuit provided in the third embodiment of the present disclosure, wherein the gate driving circuit comprises a plurality of stages of shift registers as described in any one of the first embodiment and the second embodiment.

Except for a first stage of shift register and a last stage of shift register, the output terminal of each stage of shift register is connected to the reset signal input terminal of a previous stage of shift register adjacent thereto and the exciting signal input terminal of a subsequent stage of shift register adjacent thereto, and the gate driving circuit outputs signals in sequence which are outputted from the output terminals of respective stages of shift registers.

The output terminal of the first stage of shift register is connected to the exciting signal input terminal of a second stage of shift register, and the output terminal of the last stage of shift register is connected to the reset signal input terminal of a previous stage of shift register adjacent thereto. The exciting signal input terminal of the first stage of shift register inputs a frame start signal.

The first clock signal input terminal of an odd-numbered stage of shift register inputs a first clock signal, and the second clock signal input terminal of the odd-numbered stage of shift register inputs a second clock signal.

The first clock signal input terminal of an even-numbered stage of shift register inputs the second clock signal, and the second clock signal input terminal of the even-numbered stage of shift register inputs the first clock signal.

The power supply voltage VSS is inputted to each stage of shift register via the power supply voltage input terminal. The first clock signal CLK, the second clock signal CLKB and the power supply voltage VSS are the signals which ensure that respective stages of shift registers operate properly, and the first clock signal CLK and the second clock signal CLKB have an inverted phase.

Fourth Embodiment

In the fourth embodiment of the present disclosure, there is provided a repairing method for the gate driving circuit as described in the third embodiment of the present disclosure, wherein the repairing method comprises: when a malfunction occurs in any one of shift register modules of the gate driving circuit, disconnecting the connection between the exciting signal input terminal of the shift register module having the malfunction and the exciting signal input terminal of the shift register to which the shift register module having the malfunction belongs, and establishing the connection between the exciting signal input terminal of the repairing module and the exciting signal input terminal of the shift register; and establishing the connection between the output terminal of the repairing module and the output terminal of the shift register.

Figure 8:
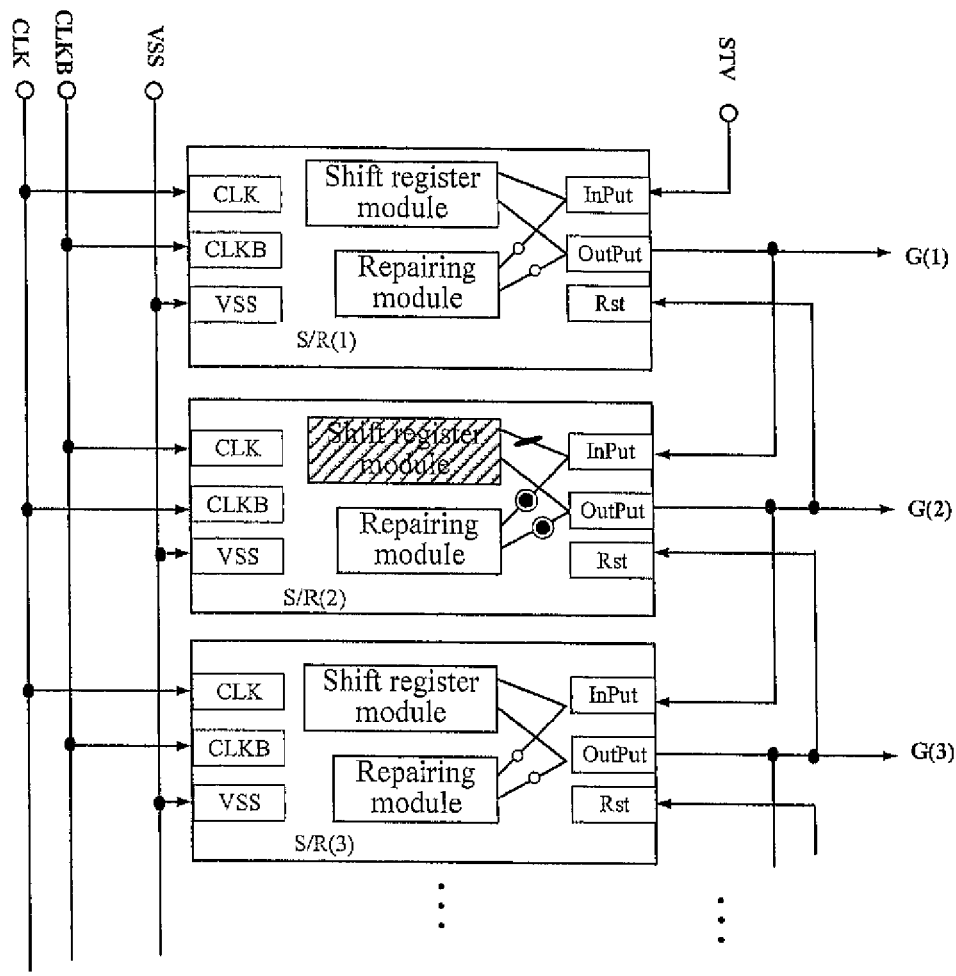
FIG. 8 is a schematic diagram in which a shift register module of a shift register is replaced by a repairing module of the shift register according to a fourth embodiment of the present disclosure.

Taking the schematic structure diagram of the gate driving circuit shown in FIG. 8 as an example, and assuming that the shift register module in the second stage of shift register S/R(2) of the gate driving circuit has a malfunction or is invalid, and that all the shift register modules in other stages of shift registers do not have a malfunction or are valid, the connection between the exciting signal input terminal InPut of the shift register module in the shift register S/R(2) and the exciting signal input terminal of the shift register S/R(2) is cut off (denoted by a solid rectangle in FIG. 8), and the connection between the exciting signal input terminal of the repairing module in the shift register S/R(2) and the exciting signal input terminal of the shift register S/R(2) is established (denoted by a circle with a solid dot inside as shown in FIG. 8); and the connection between the output terminal of the repairing module in the shift register S/R(2) and the output terminal of the shift register S/R(2) is established (denoted by a circle with a solid dot inside as shown in FIG. 8).

If the shift register in the gate driving circuit is the shift register as shown in FIG. 5, the connection between the exciting signal input terminal of the shift register module having the malfunction and the exciting signal input terminal of the shift register to which the shift register module having the malfunction belongs is cut off by a laser repairing technique.

Fifth Embodiment

In the fifth embodiment of the present disclosure, there is provided a display device comprising the gate driving circuit as described in the fourth embodiment of the present disclosure.

It will be obvious that those skilled in the art may make modifications and variations to the above embodiments without departing from the spirit and scope of the present disclosure. Such modifications and variations are intended to be included within the spirit and scope of the present disclosure provided that the modifications and variations belong to the scope of the claims of the present disclosure and the equivalence thereof.

What is claimed is:

1. A shift register comprising an output terminal, an exciting signal input terminal, a first clock signal input terminal, a first connectable link, a second connectable link, a shift register module and a repairing module; wherein the shift register module comprises a first internal output terminal, a first internal exciting signal input terminal, and a first internal clock signal input terminal configured to receive a clock signal inputted from the first clock signal input terminal of the shift register; the repairing module comprises a second internal output terminal and a second internal exciting signal input terminal;

the first connectable link is arranged between the exciting signal input terminal of the shift register, the first internal exciting signal input terminal of the shift register module and the second internal exciting signal input terminal of the repairing module, and is configured to disconnect a connection between the first internal exciting signal input terminal of the shift register module and the exciting signal input terminal of the shift register and to establish a connection between the second internal exciting signal input terminal of the repairing module and the exciting signal input terminal of the shift register in a case in which a malfunction occurs in the shift register module;

the second connectable link is arranged between the output terminal of the shift register, the first internal output terminal of the shift register module and the second internal output terminal of the repairing module, and is configured to establish a connection between the second internal output terminal of the repairing module and the output terminal of the shift register in a case in which a malfunction occurs in the shift register module;

the shift register module is configured to output a clock signal received at its own first internal clock signal input terminal via its own first internal output terminal according to an exciting signal received at its own first internal exciting signal input terminal;

the repairing module is configured to output an exciting signal received at its own second internal exciting signal input terminal after delaying the same by a half clock period via its own second internal output terminal in a case in which a malfunction occurs in the shift register module.

2. The shift register according to claim 1, wherein the repairing module comprises a first capacitor and a fifth transistor;

one terminal of the first capacitor is connected to the second internal exciting signal input terminal of the repairing module, and the other terminal of the first capacitor is grounded; and a gate of the fifth transistor is connected to the first clock signal input terminal, a first terminal of the fifth transistor is connected to the second internal exciting signal input terminal of the repairing module, and a second terminal of the fifth transistor is connected to the second internal output terminal of the repairing module.

3. The shift register according to claim 2, wherein the shift register further comprises a reset signal input terminal, the shift register module further comprises a first internal reset signal input terminal, and the reset signal input terminal of the shift register is connected to the first internal reset signal input terminal of the shift register module; the shift register module comprises:

an input module configured to receive an exciting signal from the first internal exciting signal input terminal of the shift register module, and to output a pull-up control signal to a pull-up node between the input module and a pull-up module;

the pull-up module configured to supply a signal inputted at the first internal clock signal input terminal to the first internal output terminal of the shift register module according to the pull-up control signal at the pull-up node;

a reset module configured to supply a power supply voltage to the pull-up node and the first internal output terminal of the shift register module according to a reset signal received at the first internal reset signal input terminal of the shift register module.

4. The shift register according to claim 3, wherein the input module comprises a first transistor, wherein a first terminal of the first transistor and a gate of the first transistor are connected to the first internal exciting signal input terminal of the shift register module together, and a second terminal of the first transistor is connected to the pull-up node.

5. The shift register according to claim 4, wherein the pull-up module comprises a second transistor and a second capacitor, wherein a gate of the second transistor is connected to the pull-up node, a first terminal of the second transistor is connected to the first internal clock signal input terminal, and a second terminal of the second transistor is connected to the first internal output terminal of the shift register module; and one terminal of the second capacitor is connected to the pull-up node, and the other terminal of the second capacitor is connected to the first internal output terminal of the shift register module.

6. The shift register according to claim 5, wherein the shift register further comprises a second clock signal input terminal, and the shift register module further comprises a second internal clock signal input terminal configured to receive a clock signal inputted at the second clock signal input terminal of the shift register; the reset module comprises a third transistor and a fourth transistor;
- a gate of the third transistor is connected to the first internal reset signal input terminal of the shift register module, a first terminal of the third transistor is connected to the pull-up node, and a second terminal of the third transistor is connected to a power supply voltage input terminal; and
- a gate of the fourth transistor is connected to the second internal clock signal input terminal of the shift register module, a first terminal of the fourth transistor is connected to the first internal output terminal of the shift register module, and a second terminal of the fourth transistor is connected to the power supply voltage input terminal.

7. The shift register according to claim 6, wherein in a case in which no malfunction occurs in the shift register module, the first connectable link is configured to establish the connection between the first internal exciting signal input terminal of the shift register module and the exciting signal input terminal of the shift register, and to establish the connection between the second internal exciting signal input terminal of the repairing module and the exciting signal input terminal of the shift register;
- in a case in which no malfunction occurs in the shift register module, the second connectable link is configured to establish the connection between the first internal output terminal of the shift register module and the output terminal of the shift register, and to establish the connection between the second internal output terminal of the repairing module and the output terminal of the shift register.

8. The shift register according to claim 6, wherein in a case in which a malfunction occurs in the shift register module, the second connectable link is configured to establish or to disconnect the connection between the first internal output terminal of the shift register module and the output terminal of the shift register.

9. The shift register according to claim 1, wherein in a case in which no malfunction occurs in the shift register module, the first connectable link is configured to establish the connection between the first internal exciting signal input terminal of the shift register module and the exciting signal input terminal of the shift register, and to disconnect the connection between the second internal exciting signal input terminal of the repairing module and the exciting signal input terminal of the shift register;
- in a case in which no malfunction occurs in the shift register module, the second connectable link is configured to establish the connection between the first internal output terminal of the shift register module and the output terminal of the shift register, and to disconnect the connection between the second internal output terminal of the repairing module and the output terminal of the shift register.

10. The shift register according to claim 5, wherein a ratio of a capacitance of the first capacitor to that of the second capacitor is greater than or equal to 5:1.

11. A gate driving circuit comprising a plurality of stages of shift registers according to claim 3, wherein
except for a first stage of shift register and a last stage of shift register, the output terminal of each stage of shift register is connected to the reset signal input terminal of a previous stage of shift register adjacent thereto and the exciting signal input terminal of a subsequent stage of shift register adjacent thereto; the gate driving circuit is configured to output signals in sequence which are outputted from the output terminals of respective stages of shift registers;
the output terminal of the first stage of shift register is connected to the exciting signal input terminal of a second stage of shift register, and the output terminal of the last stage of shift register is connected to the reset signal input terminal of a previous stage of shift register adjacent thereto; and
the exciting signal input terminal of the first stage of shift register is configured to input a frame start signal.

12. The gate driving circuit according to claim 11, wherein each stage of shift register further comprises a second clock signal input terminal, and the shift register module in each stage of shift register further comprises a second internal clock signal input terminal configured to receive a clock signal inputted at the second clock signal input terminal of the stage of shift register; the reset module in each stage of shift register comprises a third transistor and a fourth transistor;
- a gate of the third transistor is connected to the first internal reset signal input terminal of the shift register module, a first terminal of the third transistor is connected to the pull-up node, and a second terminal of the third transistor is connected to a power supply voltage input terminal; and
- a gate of the fourth transistor is connected to the second internal clock signal input terminal of the shift register module, a first terminal of the fourth transistor is connected to the first internal output terminal of the shift register module, and a second terminal of the fourth transistor is connected to the power supply voltage input terminal;
- the first clock signal input terminal of an odd-numbered stage of shift register is configured to input a first clock signal, and the second clock signal input terminal of the odd-numbered stage of shift register is configured to input a second clock signal;
- the first clock signal input terminal of an even-numbered stage of shift register is configured to input the second clock signal, and the second clock signal input terminal of the even-numbered stage of shift register is configured to input the first clock signal;
- the first clock signal and the second clock signal have an inverted phase.

13. The gate driving circuit according to claim 12, wherein for each stage of shift register,
- in a case in which no malfunction occurs in the shift register module, the first connectable link is configured to establish the connection between the first internal exciting signal input terminal of the shift register module and the exciting signal input terminal of the shift register, and to establish the connection between the second internal exciting signal input terminal of the repairing module and the exciting signal input terminal of the shift register;
- in a case in which no malfunction occurs in the shift register module, the second connectable link is configured to establish the connection between the first internal output terminal of the shift register module and the output terminal of the shift register, and to establish the connection between the second internal output terminal of the repairing module and the output terminal of the shift register.

14. The gate driving circuit according to claim 12, wherein for each stage of shift register,
- in a case in which a malfunction occurs in the shift register module, the second connectable link is configured to establish or to disconnect the connection between the first internal output terminal of the shift register module and the output terminal of the shift register.

15. A repairing method for the gate driving circuit according to claim 11, comprising:
when a malfunction occurs in any one of shift register modules of the gate driving circuit, disconnecting the connection between the first internal exciting signal input terminal of the shift register module having the malfunction and the exciting signal input terminal of the shift register to which the shift register module having the malfunction belongs, and establishing the connection between the second internal exciting signal input terminal of the repairing module of the shift register and the exciting signal input terminal; and
establishing the connection between the second internal output terminal of the repairing module of the shift register and the output terminal of the shift register.

* * * * *